(12) United States Patent
Nakazumi et al.

(10) Patent No.: US 11,098,195 B2
(45) Date of Patent: Aug. 24, 2021

(54) RESIN COMPOSITION, PREPREG, METAL FOIL-CLAD LAMINATE, RESIN SHEET, AND PRINTED CIRCUIT BOARD

(71) Applicant: MITSUBISHI GAS CHEMICAL COMPANY, INC., Tokyo (JP)

(72) Inventors: Yoshihiro Nakazumi, Tokyo (JP); Kentaro Takano, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 16/097,413

(22) PCT Filed: Jan. 19, 2018

(86) PCT No.: PCT/JP2018/001678
§ 371 (c)(1),
(2) Date: Oct. 29, 2018

(87) PCT Pub. No.: WO2018/147053
PCT Pub. Date: Aug. 16, 2018

(65) Prior Publication Data
US 2019/0153224 A1    May 23, 2019

(30) Foreign Application Priority Data
Feb. 7, 2017  (JP) .............................. JP2017-020525

(51) Int. Cl.
| | |
|---|---|
| *C08L 79/04* | (2006.01) |
| *C08J 5/24* | (2006.01) |
| *C08K 3/38* | (2006.01) |
| *C08G 59/40* | (2006.01) |
| *C08L 65/00* | (2006.01) |
| *C08L 61/06* | (2006.01) |
| *C08L 71/02* | (2006.01) |
| *C08L 63/00* | (2006.01) |
| *B32B 15/082* | (2006.01) |
| *H05K 1/03* | (2006.01) |
| *C08K 5/3415* | (2006.01) |
| *C08L 61/14* | (2006.01) |
| *C09D 163/00* | (2006.01) |
| *B32B 15/08* | (2006.01) |
| *B32B 27/42* | (2006.01) |
| *C08G 59/68* | (2006.01) |
| *C08G 73/06* | (2006.01) |
| *B32B 27/20* | (2006.01) |
| *C08K 5/315* | (2006.01) |

(52) U.S. Cl.
CPC .............. *C08L 79/04* (2013.01); *B32B 15/08* (2013.01); *B32B 15/082* (2013.01); *B32B 27/20* (2013.01); *B32B 27/42* (2013.01); *C08G 59/4014* (2013.01); *C08G 59/4042* (2013.01); *C08G 59/686* (2013.01); *C08G 73/065* (2013.01); *C08J 5/24* (2013.01); *C08K 3/38* (2013.01); *C08K 5/3415* (2013.01); *C08L 61/06* (2013.01); *C08L 61/14* (2013.01); *C08L 63/00* (2013.01); *C08L 65/00* (2013.01); *C08L 71/02* (2013.01); *C09D 163/00* (2013.01); *H05K 1/03* (2013.01); *H05K 1/0373* (2013.01); *B32B 2311/12* (2013.01); *B32B 2311/24* (2013.01); *B32B 2325/00* (2013.01); *B32B 2361/00* (2013.01); *B32B 2363/00* (2013.01); *B32B 2371/00* (2013.01); *B32B 2386/00* (2013.01); *B32B 2457/08* (2013.01); *C08G 2261/135* (2013.01); *C08G 2261/3424* (2013.01); *C08G 2261/45* (2013.01); *C08G 2261/76* (2013.01); *C08J 2379/04* (2013.01); *C08J 2463/00* (2013.01); *C08K 5/315* (2013.01); *C08K 2003/385* (2013.01); *C08L 2203/206* (2013.01)

(58) Field of Classification Search
CPC ....... B32B 15/082; B32B 27/42; C08L 65/00; C08L 71/02; C08G 59/686; C08G 73/065; H05K 1/03
USPC ........................................................ 524/404
See application file for complete search history.

(56) References Cited

U.S. PATENT DOCUMENTS

| | | | |
|---|---|---|---|
| 2013/0157061 A1 | 6/2013 | Sogame et al. | |
| 2013/0337269 A1 | 12/2013 | Ohtsuka et al. | |
| 2014/0349089 A1 | 11/2014 | Ueyama et al. | |
| 2015/0034369 A1* | 2/2015 | Kashima | H05K 1/0296 174/255 |
| 2016/0125971 A1 | 5/2016 | Hasebe et al. | |
| 2016/0125972 A1* | 5/2016 | Arii | C08L 61/18 428/418 |
| 2016/0219700 A1* | 7/2016 | Hamajima | B29C 51/14 |
| 2017/0008767 A1 | 1/2017 | Kurokawa et al. | |
| 2018/0163015 A1* | 6/2018 | Takezawa | C08K 3/38 |

FOREIGN PATENT DOCUMENTS

| | | | |
|---|---|---|---|
| EP | 2860219 A1 | 4/2015 | |
| EP | 3 321 298 A1 | 5/2018 | |
| JP | 2007-284596 A | 11/2007 | |
| JP | 2009-280720 A | 12/2009 | |
| JP | 2010-174242 A | 8/2010 | |

(Continued)

OTHER PUBLICATIONS

Machine translation of JP 2015-151483 (Year: 2015).*
Machine translation of JP 2015-212217 (Year: 2015).*
Machine translation of JP 2017-137492 (Year: 2017).*
International Search report issued with respect to Patent Application No. PCT/JP2018/001678, dated Mar. 13, 2018.

(Continued)

*Primary Examiner* — Doris L Lee
(74) *Attorney, Agent, or Firm* — Greenblum & Bernstein, P.L.C.

(57) ABSTRACT

A resin composition according to the present invention contains a cyanate compound (A). Further, the resin composition according to the present invention contains a maleimide compound (B) and/or an epoxy resin (C); and primary hexagonal boron nitride particles (D) having an average aspect ratio of 4 to 10.

12 Claims, No Drawings

(56) References Cited

FOREIGN PATENT DOCUMENTS

| | | | |
|---|---|---|---|
| JP | 2010-189470 A | | 9/2010 |
| JP | 2015-151483 | * | 8/2015 |
| JP | 2015-212217 | * | 11/2015 |
| JP | 2017-137492 | * | 8/2017 |
| KR | 10-2016-0014643 | | 2/2016 |
| WO | 2011/152402 A1 | | 12/2011 |
| WO | 2012/121224 A1 | | 9/2012 |
| WO | 2013/069479 A1 | | 5/2013 |
| WO | WO 2014/203866 | * | 12/2014 |
| WO | WO 2015/033731 | * | 3/2015 |
| WO | 2015/122378 A1 | | 8/2015 |
| WO | 2016/093248 A1 | | 6/2016 |
| WO | 2016/190260 A1 | | 12/2016 |
| WO | WO 2016/190260 | * | 12/2016 |
| WO | 2017/006891 A1 | | 1/2017 |
| WO | 2017/145869 A | | 8/2017 |
| WO | 2017/155110 A1 | | 9/2017 |

OTHER PUBLICATIONS

Iredale et al., "Modern advances in bismaleimide resin technology: A 21$^{st}$ century perspective on the chemistry of addition polyimides," *Progress in Polymer Science*, vol. 69, Dec. 13, 2016, pp. 1-21.

* cited by examiner

RESIN COMPOSITION, PREPREG, METAL FOIL-CLAD LAMINATE, RESIN SHEET, AND PRINTED CIRCUIT BOARD

TECHNICAL FIELD

The present invention relates to a resin composition, a prepreg, a metal foil-clad laminate, a resin sheet and a printed circuit board.

BACKGROUND ART

In recent years, with higher speed and higher integration of the circuits of electrical equipment or electronic equipment, and an increase in the packaging density of heat-generating electronic components on printed circuit boards, the heat generation density inside electronic equipment increases year by year. Therefore, members having high thermal conductivity and electrical insulation properties that efficiently dissipate heat generated in electronic components and the like are required.

Thermosetting resins such as epoxy resins used for the insulating layers of printed circuit boards have low thermal conductivity in themselves. Therefore, a method of highly filling a thermosetting resin with an inorganic filler having excellent thermal conductivity in order to improve thermal conductivity as a printed circuit board is known. But, when a thermosetting resin composition is highly filled with an inorganic filler, the volume ratio of the thermosetting resin decreases, and the moldability deteriorates, and cracks and voids are likely to occur between the resin and the inorganic filler. Therefore, there are problems of deterioration of moisture absorption heat resistance characteristics, a decrease in the modulus, and further the adhesiveness between the resin and the inorganic filler being insufficient and the copper foil peel strength decreasing. In view of such problems, using various resin compositions is proposed.

For example, in Patent Literature 1, it is described that a resin composition, which contains a naphthol aralkyl-based cyanate resin and an epoxy resin and in which a particular amount of an inorganic filler is blended, exhibits excellent heat resistance, thermal conductivity, and water absorbency.

In addition, in Patent Literature 2, it is described that a resin composition, which contains a cyanate compound and an epoxy resin and in which two inorganic fillers having different particle diameters are blended, has good moldability and exhibits high heat dissipation characteristics, high glass transition temperature, copper foil peel strength, and moisture absorption heat resistance.

Further, in Patent Literature 3, it is described that a resin composition, which contains an epoxy resin and a curing agent and in which borate particles covered with hexagonal boron nitride are blended as an inorganic filler, exhibits high glass transition temperature, copper foil peel strength, moisture absorption heat resistance, flame retardancy, a low thermal expansion coefficient, and high heat dissipation characteristics.

CITATION LIST

Patent Literature

Patent Literature 1: International Publication No. WO 2011/152402
Patent Literature 2: International Publication No. WO 2013/069479
Patent Literature 3: International Publication No. WO 2012/121224

SUMMARY OF INVENTION

Technical Problem

With the resin compositions described in Patent Literatures 1 to 3, improvements in physical properties such as thermal conductivity and copper foil peel strength seem to be achieved to some extent, but there is still room for improvement in these physical properties. Particularly, a resin composition that has sufficient thermal conductivity and exhibits excellent peel strength and moisture absorption heat resistance is not obtained by the techniques described in these literatures.

The present invention has been made in view of the above problems, and an object of the present invention is to provide a resin composition, a prepreg, a metal foil-clad laminate, a resin sheet, and a printed circuit board, that have sufficient thermal conductivity and can exhibit excellent peel strength and moisture absorption heat resistance.

Solution to Problem

The present inventors have diligently studied in order to solve the above problems. As a result, the present inventors have found that the above problems can be solved by blending an inorganic filler, in which the average aspect ratio of primary hexagonal boron nitride particles is adjusted in a particular range, with a resin composition comprising a cyanate compound (A), and a maleimide compound (B) and/or an epoxy resin (C), thereby leading to completion of the present invention.

Specifically, the present invention includes the following aspects.

[1]

A resin composition comprising:

a cyanate compound (A);

a maleimide compound (B) and/or an epoxy resin (C); and primary hexagonal boron nitride particles (D) having an average aspect ratio of 4 to 10.

[2]

The resin composition according to [1], wherein the cyanate compound (A) comprises at least one selected from a group consisting of a phenol novolac-based cyanate compound, a naphthol aralkyl-based cyanate compound represented by the following formula (A-1), and a biphenyl aralkyl-based cyanate compound represented by the following formula (A-2),

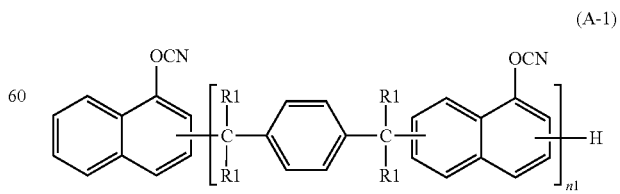

wherein R1 each independently represents a hydrogen atom or a methyl group, and n1 represents an integer of 1 to 50,

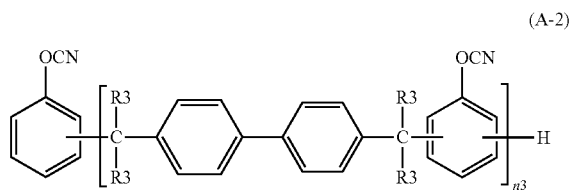

(A-2)

wherein R3 each independently represents a hydrogen atom or a methyl group, and n3 represents an integer of 1 to 50.

[3]

The resin composition according to [1] or [2], wherein a content of the cyanate compound (A) is 1 to 90 parts by mass based on 100 parts by mass of a resin solid component in the resin composition.

[4]

The resin composition according to any of [1] to [3], wherein the maleimide compound (B) comprises at least one selected from a group consisting of 2,2'-bis{4-(4-maleimidophenoxy)-phenyl}propane, bis(3-ethyl-5-methyl-4-maleimidophenyl)methane, a maleimide compound represented by the following formula (B-1), and a maleimide compound represented by the following formula (B-2),

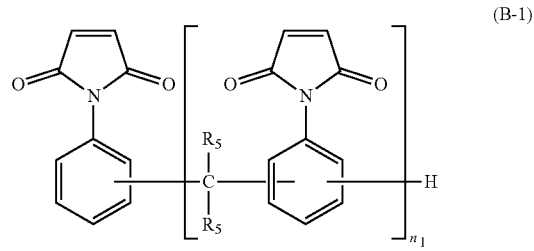

(B-1)

wherein $R_5$ each independently represents a hydrogen atom or a methyl group, and $n_1$ represents an integer of 1 or more,

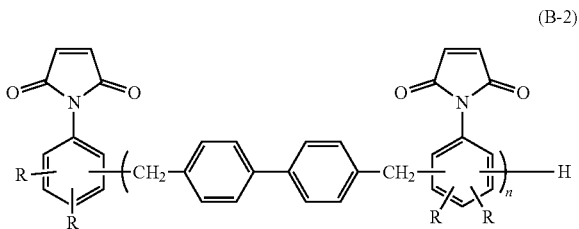

(B-2)

wherein a plurality of R each independently represent a hydrogen atom, an alkyl group having 1 to 5 carbon atoms, or a phenyl group, and n is an average value and represents $1<n\leq5$.

[5]

The resin composition according to any of [1] to [4], wherein a content of the maleimide compound (B) is 10 to 90 parts by mass based on 100 parts by mass of the resin solid component in the resin composition.

[6]

The resin composition according to any of [1] to [5], wherein an epoxy equivalent weight of the epoxy resin (C) is 250 to 850 g/eq.

[7]

The resin composition according to any of [1] to [6], wherein the epoxy resin (C) comprises at least one selected from a group consisting of a biphenyl aralkyl-based epoxy resin, a naphthylene ether-based epoxy resin, a polyfunctional phenol-based epoxy resin, and a naphthalene-based epoxy resin.

[8]

The resin composition according to any of [1] to [7], wherein a content of the epoxy resin (C) is 1 to 90 parts by mass based on 100 parts by mass of the resin solid component in the resin composition.

[9]

The resin composition according to any of [1] to [8], further comprising at least one selected from a group consisting of a phenolic resin, an oxetane resin, a benzoxazine compound, and a compound having a polymerizable unsaturated group.

[10]

The resin composition according to any of [1] to [9], wherein a content of the primary hexagonal boron nitride particles (D) is 50 to 1600 parts by mass based on 100 parts by mass of the resin solid component.

[11]

A prepreg comprising:
a base material; and
the resin composition according to any of [1] to [10], with which the base material is impregnated or coated.

[12]

A metal foil-clad laminate comprising:
at least one or more of the prepregs according to [11] laminated; and
a metal foil disposed on one surface or both surfaces of the prepreg.

[13]

A resin sheet comprising:
a support; and
the resin composition according to any of [1] to [10], disposed on a surface of the support.

[14]

A printed circuit board comprising:
an insulating layer; and
a conductor layer formed on a surface of the insulating layer, wherein
the insulating layer comprises the resin composition according to any of [1] to [10].

Advantageous Effect of Invention

According to the present invention, a resin composition, a prepreg, a metal foil-clad laminate, a resin sheet, and a printed circuit board, that have sufficient thermal conductivity and can exhibit excellent peel strength and moisture absorption heat resistance, can be provided.

Description of Embodiment

A embodiment for carrying out the present invention (hereinafter referred to as "the present embodiment") will be described in detail below, but the present invention is not limited to this, and various modifications can be made without departing from the spirit thereof.

[Resin composition]

A resin composition in the present embodiment comprises a cyanate compound (A); a maleimide compound (B) and/or an epoxy resin (C); and primary hexagonal boron nitride particles (D) having an average aspect ratio of 4 to 10. The resin composition in the present embodiment is configured in this manner and therefore has sufficient thermal conductivity and can exhibit excellent peel strength and moisture absorption heat resistance. The components constituting the resin composition in the present embodiment will be described below.

(Cyanate Compound (A))

From the viewpoint of thermal conductivity, peel strength, and moisture absorption heat resistance, the resin composition in the present embodiment comprises the cyanate compound (A). The cyanate compound (A) is not particularly limited as long as it is a resin having in the molecule an aromatic moiety substituted by at least one cyanato group (cyanate group).

One example of such a cyanate compound (A) includes one represented by the following formula (1):

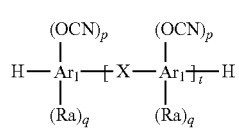

(1)

wherein $Ar_1$ represents a benzene ring, a naphthalene ring, or two benzene rings bonded to each other via a single bond, and may be the same as or different from each other when there are a plurality of $Ar_1$. Ra each independently represents a hydrogen atom, an alkyl group having 1 to 6 carbon atoms, an aryl group having 6 to 12 carbon atoms, an alkoxyl group having 1 to 4 carbon atoms, or a group in which an alkyl group having 1 to 6 carbon atoms and an aryl group having 6 to 12 carbon atoms are bonded to each other. The aromatic ring for Ra may have a substituent, and any position can be selected for the substituents in $Ar_1$ and Ra. p represents the number of cyanato groups bonded to $Ar_1$ and is each independently an integer of 1 to 3. q represents the number of Ra bonded to $Ar_1$ and is 4−p when $Ar_1$ is a benzene ring, 6−p when $Ar_1$ is a naphthalene ring, and 8−p when $Ar_1$ is two benzene rings bonded to each other via a single bond. t represents the average number of repetitions and is in the range of 0 to 50, and the cyanate compound (A) may be a mixture of compounds having different t. X represents any of a single bond, a divalent organic group having 1 to 50 carbon atoms (a hydrogen atom may be replaced by a heteroatom), a divalent organic group having 1 to 10 nitrogen atoms (for example, —N—R—N— (wherein R represents an organic group)), a carbonyl group (—CO—), a carboxy group (—C(=O)O—), a carbonyl dioxide group (—OC(=O)O—), a sulfonyl group (—SO$_2$—), a divalent sulfur atom, or a divalent oxygen atom, and X is each independently as defined above when there are a plurality of X.

The alkyl group for Ra in the formula (1) may have either of a linear or branched chain structure and a cyclic structure (for example, a cycloalkyl group).

In addition, a hydrogen atom in the alkyl group and the aryl group for Ra in the formula (1) may be replaced by a halogen atom such as a fluorine atom or a chlorine atom, an alkoxyl group such as a methoxy group or a phenoxy group, a cyano group, or the like.

Specific examples of the alkyl group include a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, a cyclohexyl group, and a trifluoromethyl group.

Specific examples of the aryl group include a phenyl group, a xylyl group, a mesityl group, a naphthyl group, a phenoxyphenyl group, an ethylphenyl group, an o-, m-, or p-fluorophenyl group, a dichlorophenyl group, a dicyanophenyl group, a trifluorophenyl group, a methoxyphenyl group, and an o-, m-, or p-tolyl group. Further, examples of the alkoxyl group include a methoxy group, an ethoxy group, a propoxy group, an isopropoxy group, a n-butoxy group, an isobutoxy group, and a tert-butoxy group.

Specific examples of the divalent organic group having 1 to 50 carbon atoms for X in the formula (1) include a methylene group, an ethylene group, a trimethylene group, a cyclopentylene group, a cyclohexylene group, a trimethylcyclohexylene group, a biphenylylmethylene group, a dimethylmethylene-phenylene-dimethylmethylene group, a fluorenediyl group, and a phthalidediyl group. A hydrogen atom in the divalent organic group may be replaced by a halogen atom such as a fluorine atom or a chlorine atom, an alkoxyl group such as a methoxy group or a phenoxy group, a cyano group, or the like.

Examples of the divalent organic group having 1 to 10 nitrogen atoms for X in the formula (1) include an imino group and a polyimide group.

In addition, examples of the organic group of X in the formula (1) include one having a structure represented by the following formula (2) or the following formula (3).

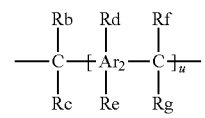

(2)

wherein $Ar_2$ represents a benzenetetrayl group, a naphthalenetetrayl group, or a biphenyltetrayl group, and may be the same as or different from each other when u is 2 or more. Rb, Rc, Rf, and Rg each independently represent a hydrogen atom, an alkyl group having 1 to 6 carbon atoms, an aryl group having 6 to 12 carbon atoms, a trifluoromethyl group, or an aryl group having at least one phenolic hydroxy group; Rd and Re are each independently selected from any one of a hydrogen atom, an alkyl group having 1 to 6 carbon atoms, an aryl group having 6 to 12 carbon atoms, an alkoxyl group having 1 to 4 carbon atoms, or a hydroxy group; and u represents an integer of 0 to 5.

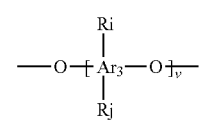

(3)

wherein $Ar_3$ represents a benzenetetrayl group, a naphthalenetetrayl group, or a biphenyltetrayl group, and may be the same as or different from each other when v is 2 or more; Ri and Rj each independently represent a hydrogen atom, an alkyl group having 1 to 6 carbon atoms, an aryl group having 6 to 12 carbon atoms, a benzyl group, an alkoxyl group having 1 to 4 carbon atoms, a hydroxy group, a trifluoromethyl group, or an aryl group substituted by at least one cyanato group; and v represents an integer of 0 to 5, and the cyanate compound may be a mixture of compounds having different v.

Further, examples of X in the formula (1) include divalent groups represented by the following formulas:

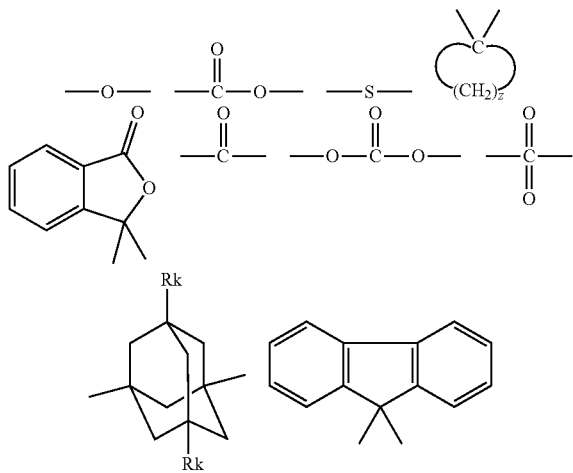

wherein z represents an integer of 4 to 7; and Rk each independently represents a hydrogen atom or an alkyl group having 1 to 6 carbon atoms.

Specific examples of $Ar_2$ in formula (2) and $Ar_3$ in formula (3) include a benzenetetrayl group to which two carbon atoms shown in formula (2) or two oxygen atoms shown in formula (3) are bonded at positions 1 and 4 or positions 1 and 3, a biphenyltetrayl group to which the above two carbon atoms or two oxygen atoms are bonded at positions 4 and 4', positions 2 and 4', positions 2 and 2', positions 2 and 3', positions 3 and 3', or positions 3 and 4', and a naphthalenetetrayl group to which the above two carbon atoms or two oxygen atoms are bonded at positions 2 and 6, positions 1 and 5, positions 1 and 6, positions 1 and 8, positions 1 and 3, positions 1 and 4, or positions 2 and 7.

The alkyl group and the aryl group for Rb, Rc, Rd, Re, Rf, and Rg in formula (2) and Ri and Rj in formula (3) have the same meanings as those in the above formula (1).

Specific examples of the cyanato-substituted aromatic compound represented by the above formula (1) include cyanatobenzene, 1-cyanato-2-, 1-cyanato-3-, or 1-cyanato-4-methylbenzene, 1-cyanato-2-, 1-cyanato-3-, or 1-cyanato-4-methoxybenzene, 1-cyanato-2,3-, 1-cyanato-2,4-, 1-cyanato-2,5-, 1-cyanato-2,6-, 1-cyanato-3,4-, or 1-cyanato-3,5-dimethylbenzene, cyanatoethylbenzene, cyanatobutylbenzene, cyanatooctylbenzene, cyanatononylbenzene, 2-(4-cyanaphenyl)-2-phenylpropane (a cyanate of 4-α-cumylphenol), 1-cyanato-4-cyclohexylbenzene, 1-cyanato-4-vinylbenzene, 1-cyanato-2- or 1-cyanato-3-chlorobenzene, 1-cyanato-2,6-dichlorobenzene, 1-cyanato-2-methyl-3-chlorobenzene, cyanatonitrobenzene, 1-cyanato-4-nitro-2-ethylbenzene, 1-cyanato-2-methoxy-4-allylbenzene (a cyanate of eugenol), methyl(4-cyanatophenyl)sulfide, 1-cyanato-3-trifluoromethylbenzene, 4-cyanatobiphenyl, 1-cyanato-2- or 1-cyanato-4-acetylbenzene, 4-cyanatobenzaldehyde, methyl 4-cyanatobenzoate ester, phenyl 4-cyanatobenzoate ester, 1-cyanato-4-acetaminobenzene, 4-cyanatobenzophenone, 1-cyanato-2,6-di-tert-butylbenzene, 1,2-dicyanatobenzene, 1,3-dicyanatobenzene, 1,4-dicyanatobenzene, 1,4-dicyanato-2-tert-butylbenzene, 1,4-dicyanato-2,4-dimethylbenzene, 1,4-dicyanato-2,3,4-dimethylbenzene, 1,3-dicyanato-2,4,6-trimethylbenzene, 1,3-dicyanato-5-methylbenzene, 1-cyanato- or 2-cyanatonaphthalene, 1-cyanato4-methoxynaphthalene, 2-cyanato-6-methylnaphthalene, 2-cyanato-7-methoxynaphthalene, 2,2'-dicyanato-1,1'-binaphthyl, 1,3-, 1,4-, 1,5-, 1,6-, 1,7-, 2,3-, 2,6-, or 2,7-dicyanatonaphthalene, 2,2'- or 4,4'-dicyanatobiphenyl, 4,4'-dicyanatooctafluorobiphenyl, 2,4'- or 4,4'-dicyanatodiphenylmethane, bis(4-cyanato-3,5-dimethylphenyl) methane, 1,1-bis(4-cyanatophenyl)ethane, 1,1-bis(4-cyanatophenyl)propane, 2,2-bis(4-cyanatophenyl)propane, 2,2-bis(4-cyanato-3-methylphenyl)propane, 2,2-bis(2-cyanato-5-biphenylyl)propane, 2,2-bis(4-cyanatophenyl)hexafluoropropane, 2,2-bis(4-cyanato-3,5-dimethylphenyl)propane, 1,1-bis(4-cyanatophenyl)butane, 1,1-bis(4-cyanatophenyl)isobutane, 1,1-bis(4-cyanatophenyl)pentane, 1,1-bis(4-cyanatophenyl)-3-methylbutane, 1,1-bis(4-cyanatophenyl)-2-methylbutane, 1,1-bis(4-cyanatophenyl)-2,2-dimethylpropane, 2,2-bis(4-cyanatophenyl)butane, 2,2-bis(4-cyanatophenyl)pentane, 2,2-bis(4-cyanatophenyl)hexane, 2,2-bis(4-cyanatophenyl)-3-methylbutane, 2,2-bis(4-cyanatophenyl)-4-methylpentane, 2,2-bis(4-cyanatophenyl)-3,3-dimethylbutane, 3,3-bis(4-cyanatophenyl)hexane, 3,3-bis(4-cyanatophenyl)heptane, 3,3-bis(4-cyanatophenyl)octane, 3,3-bis(4-cyanatophenyl)-2-methylpentane, 3,3-bis(4-cyanatophenyl)-2-methylhexane, 3,3-bis(4-cyanatophenyl)-2,2-dimethylpentane, 4,4-bis(4-cyanatophenyl)-3-methylheptane, 3,3-bis(4-cyanatophenyl)-2-methylheptane, 3,3-bis(4-cyanatophenyl)-2,2-dimethylhexane, 3,3-bis(4-cyanatophenyl)-2,4-dimethylhexane, 3,3-bis(4-cyanatophenyl)-2,2,4-trimethylpentane, 2,2-bis(4-cyanatophenyl)-1,1,1,3,3,3-hexafluoropropane, bis(4-cyanatophenyl)phenylmethane, 1,1-bis(4-cyanatophenyl)-1-phenylethane, bis(4-cyanatophenyl)biphenylmethane, 1,1-bis(4-cyanatophenyl) cyclopentane, 1,1-bis(4-cyanatophenyl)cyclohexane, 2,2-bis(4-cyanato-3-isopropylphenyl)propane, 1,1-bis(3-cyclohexyl-4-cyanatophenyl)cyclohexane, bis(4-cyanatophenyl) diphenylmethane, bis(4-cyanatophenyl)-2,2-dichloroethylene, 1,3-bis[2-(4-cyanatophenyl)-2-propyl]benzene, 1,4-bis[2-(4-cyanatophenyl)-2-propyl]benzene, 1,1-bis(4-cyanatophenyl)-3,3,5-trimethylcyclohexane, 4-[bis(4-cyanatophenyl)methyl]biphenyl, 4,4-dicyanatobenzophenone, 1,3-bis(4-cyanatophenyl)-2-propen-1-one, bis (4-cyanatophenyl) ether, bis(4-cyanatophenyl) sulfide, bis (4-cyanatophenyl) sulfone, 4-cyanatobenzoic acid-4-cyanatophenyl ester (4-cyanatophenyl-4-cyanatobenzoate), bis-(4-cyanatophenyl) carbonate, 1,3-bis(4-cyanatophenyl) adamantane, 1,3-bis(4-cyanatophenyl)-5,7-dimethyladamantane, 3,3-bis(4-cyanatophenyl)isobenzofuran-1(3H)-one (a cyanate of phenolphthalein), 3,3-bis(4-cyanato-3-methylphenyl)isobenzofuran-1(3H)-one (a cyanate of o-cresolphthalein), 9,9'-bis(4-cyanatophenyl)fluorene, 9,9-bis(4-cyanato-3-methylphenyl)fluorene, 9,9-bis(2-cyanato-5-biphenylyl)fluorene, tris(4-cyanatophenyl)methane, 1,1,1-tris(4-cyanatophenyl)ethane, 1,1,3-tris(4-cyanatophenyl) propane, α,α,α'-tris(4-cyanatophenyl)-1-ethyl-4-isopropylbenzene, 1,1,2,2-tetrakis(4-cyanatophenyl)ethane, tetrakis(4-cyanatophenyl)methane, 2,4,6-tris(N-methyl-4-cyanatoanilino)-1,3,5-triazine, 2,4-bis(N-methyl-4-cyanatoanilino)-6-(N-methylanilino)-1,3,5-triazine, bis(N-4-cyanato-2-methylphenyl)-4,4'-oxydiphthalimide, bis(N-3-cyanato-4-methylphenyl)-4,4'-oxydiphthalimide, bis(N-4-cyanatophenyl)-4,4'-oxydiphthalimide, bis(N-4-cyanato-2-methylphenyl)-4,4'-(hexafluoroisopropylidene) diphthalimide, tris(3,5-dimethyl-4-cyanatobenzyl) isocyanurate, 2-phenyl-3,3-bis(4-cyanatophenyl)phthalimidine, 2-(4-methylphenyl)-3,3-bis(4-cyanatophenyl)phthalimidine, 2-phenyl-3,3-bis(4-cyanato-3-methylphenyl)phthalimidine, 1-methyl-3,3-bis(4-cyanatophenyl)indolin-2-one, and 2-phenyl-3,3-bis(4-cyanatophenyl)indolin-2-one.

In addition, other specific examples of the compound represented by the formula (1) include those obtained by cyanation of phenolic resins such as phenol novolac resins and cresol novolac resins (those obtained by reacting a phenol, an alkyl-substituted phenol, or a halogen-substituted phenol and a formaldehyde compound such as formalin or paraformaldehyde in an acidic solution by a known method), trisphenol novolac resins (those obtained by reacting hydroxybenzaldehyde and a phenol in the presence of an acidic catalyst), fluorene novolac resins (those obtained by reacting a fluorenone compound and a 9,9-bis(hydroxyaryl)fluorene in the presence of an acidic catalyst), phenol aralkyl resins, cresol aralkyl resins, naphthol aralkyl resins, and biphenyl aralkyl resins (those obtained by reacting a bishalogenomethyl compound as represented by $Ar_4$—$(CH_2Y)_2$ ($Ar_4$ represents a phenyl group, and Y represents a halogen atom; and the same applies below in this paragraph) and a phenol compound with an acidic catalyst or without a catalyst by a known method, those obtained by reacting a bis(alkoxymethyl) compound as represented by $Ar_4$—$(CH_2OR)_2$ and a phenol compound in the presence of an acidic catalyst by a known method, or those obtained by reacting a bis(hydroxymethyl) compound as represented by $Ar_4$—$(CH_2OH)_2$ and a phenol compound in the presence of an acidic catalyst by a known method, or those obtained by polycondensing an aromatic aldehyde compound, an aralkyl compound, and a phenol compound by a known method), phenol-modified xylene formaldehyde resins (those obtained by reacting a xylene formaldehyde resin and a phenol compound in the presence of an acidic catalyst by a known method), modified naphthalene formaldehyde resins (those obtained by reacting a naphthalene formaldehyde resin and a hydroxy-substituted aromatic compound in the presence of an acidic catalyst by a known method), and phenol-modified dicyclopentadiene resins, and phenolic resins having a polynaphthylene ether structure (those obtained by subjecting a polyvalent hydroxynaphthalene compound having two or more phenolic hydroxy groups in one molecule to dehydration condensation in the presence of a basic catalyst by a known method) by a method similar to the above, and prepolymers thereof. These are not particularly limited. One of these cyanate compounds (A) can be used alone, or two or more of these cyanate compounds (A) can be used in combination.

Among these, phenol novolac-based cyanate compounds, naphthol aralkyl-based cyanate compounds, biphenyl aralkyl-based cyanate compounds, naphthylene ether-based cyanate compounds, xylene resin-based cyanate compounds, and adamantane skeleton-based cyanate compounds are preferred, and phenol novolac-based cyanate compounds, biphenyl aralkyl-based cyanate compounds, and naphthol aralkyl-based cyanate compounds are more preferred. In other words, the cyanate compound (A) in the present embodiment particularly preferably contains at least one selected from the group consisting of a phenol novolac-based cyanate compound, a naphthol aralkyl-based cyanate compound represented by the following formula (A-1), and a biphenyl aralkyl-based cyanate compound represented by the following formula (A-2). The phenol novolac-based cyanate compound is not particularly limited, and commercial products can also be used. For example, Primaset PT-30 manufactured by Lonza can be used.

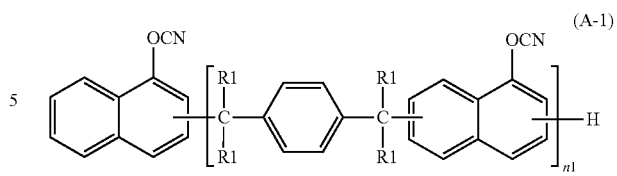

wherein R1 each independently represents a hydrogen atom or a methyl group, and n1 represents an integer of 1 to 50.

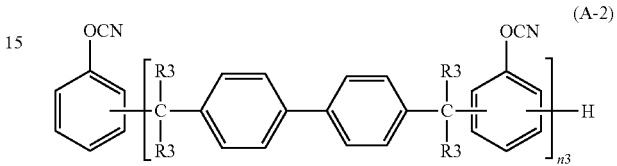

wherein R3 each independently represents a hydrogen atom or a methyl group, and n3 represents an integer of 1 to 50.

Resin cured products using these cyanate compounds (A) have characteristics excellent in glass transition temperature (Tg), plating adhesiveness, and the like.

The method for producing these cyanate compounds (A) is not particularly limited, and known methods can be used. Examples of such a production method include a method of obtaining or synthesizing a hydroxy group-containing compound having the desired skeleton, and modifying the hydroxy group by a known method for cyanation. Examples of the method of cyanation of a hydroxy group include a method described in Ian Hamerton, "Chemistry and Technology of Cyanate Ester Resins," Blackie Academic & Professional.

The content of the cyanate compound (A) is preferably 1 to 90 parts by mass, more preferably 5 to 85 parts by mass, and further preferably 10 to 80 parts by mass, based on 100 parts by mass of resin solid component from the viewpoint of desmear resistance and a modulus at high heat.

In the present embodiment, the "resin solid component" refers to components in the resin composition in the present embodiment excluding a solvent and the primary hexagonal boron nitride particles (D) unless otherwise noted, and "100 parts by mass of resin solid component" refers to the total of the components in the resin composition in the present embodiment excluding the solvent and the primary hexagonal boron nitride particles (D) being 100 parts by mass.

(Maleimide Compound (B))

In the resin composition in the present embodiment, the maleimide compound (B) is an optional component and need not be contained, but from the viewpoint of heat resistance, the resin composition in the present embodiment preferably comprises the maleimide compound (B). The maleimide compound (B) is not particularly limited as long as it is a compound having one or more maleimide groups in the molecule. Examples of the maleimide compound (B) include N-phenylmaleimide, N-hydroxyphenylmaleimide, bis(4-maleimidophenyl)methane, 2,2-bis{4-(4-maleimidophenoxy)-phenyl}propane, bis(3,5-dimethyl-4-maleimidophenyl)methane, bis(3-ethyl-5-methyl-4-maleimidophenyl)methane, bis(3,5-diethyl-4-maleimidophenyl)methane, a maleimide compound represented by the following formula (B-1), a maleimide compound represented by the following formula (B-2), prepolymers of these maleimide compounds, or prepolymers of maleimide compounds and amine compounds. Among these, at least one selected from the group consisting of 2,2'-bis{4-(4-maleimidophenoxy)phenyl}propane, bis(3-ethyl-5-methyl-4-maleimidophenyl)methane, and the maleimide compound represented by the following formula (B-1), and the maleimide compound represented by the following formula (B-2) is preferred. When the resin composition in the present embodiment comprises such a maleimide compound (B), the thermal expansion coefficient of the obtained cured product tends to decrease more, and the glass transition temperature tends to be better. From a similar viewpoint, the maleimide compound (B) more preferably contains at least one selected from the group consisting of bis(3-ethyl-5-methyl-4-maleimidophenyl)methane and the maleimide compound represented by the following formula (B-1):

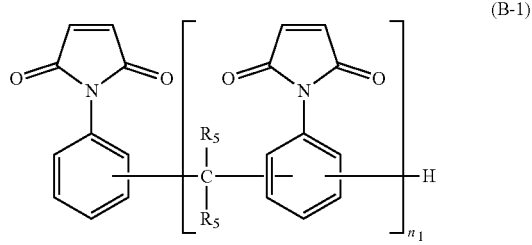

(B-1)

wherein $R_5$ each independently represents a hydrogen atom or a methyl group and preferably represents a hydrogen atom. In addition, in formula (B-1), $n_1$ represents an integer of 1 or more and is preferably an integer of 10 or less, more preferably an integer of 7 or less.

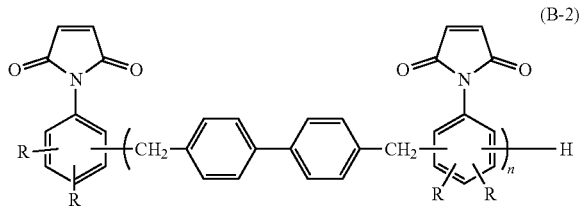

(B-2)

wherein a plurality of R each independently represent a hydrogen atom, an alkyl group having 1 to 5 carbon atoms (for example, a methyl group, an ethyl group, a n-propyl group, an isopropyl group, a n-butyl group, an isobutyl group, a t-butyl group, or a n-pentyl group), or a phenyl group. Among these, the plurality of R are each independently preferably a group selected from the group consisting of a hydrogen atom, a methyl group, and a phenyl group, more preferably one of a hydrogen atom and a methyl group, and further preferably a hydrogen atom from the viewpoint of even more improving flame resistance and peel strength.

In the above formula (B-2), n is an average value and represents $1 < n \leq 5$. n is preferably 4 or less, more preferably 3 or less, and further preferably 2 or less from the viewpoint of even better solvent solubility.

The polymaleimide compound represented by the above formula (B-2) may be prepared by a known method, and a commercial product may be used. Examples of the commercial product include, but are not limited to, a product of Nippon Kayaku Co., Ltd., "MIR-3000".

The content of the maleimide compound (B) in the present embodiment is preferably 10 to 90 parts by mass, more preferably 5 to 85 parts by mass, and further preferably 10 to 80 parts by mass, based on 100 parts by mass of the resin solid component. When the content of the maleimide compound (B) is in the above range, the thermal expansion coefficient of the obtained cured product tends to decrease more, and the heat resistance tends to improve more.

(Epoxy Resin (C))

In the resin composition in the present embodiment, the epoxy resin (C) is an optional component and need not be contained, but from the viewpoint of making adhesion and flexibility better, the resin composition in the present embodiment preferably comprises the epoxy resin (C). As the epoxy resin, known ones can be appropriately used as long as they are epoxy resins having two or more epoxy groups in one molecule. The type of the epoxy resin is not particularly limited. Specific examples include bisphenol A-based epoxy resins, bisphenol E-based epoxy resins, bisphenol F-based epoxy resins, bisphenol S-based epoxy resins, phenol novolac-based epoxy resins, bisphenol A novolac-based epoxy resins, glycidyl ester-based epoxy resins, aralkyl novolac-based epoxy resins, biphenyl aralkyl-based epoxy resins, naphthylene ether-based epoxy resins, cresol novolac-based epoxy resins, polyfunctional phenol-based epoxy resins, naphthalene-based epoxy resins, anthracene-based epoxy resins, naphthalene skeleton-modified novolac-based epoxy resins, phenol aralkyl-based epoxy resins, naphthol aralkyl-based epoxy resins, dicyclopentadiene-based epoxy resins, biphenyl-based epoxy resins, alicyclic epoxy resins, polyol-based epoxy resins, phosphorus-containing epoxy resins, glycidyl amines, glycidyl esters, compounds obtained by epoxidizing double bonds of butadiene and the like, and compounds obtained by reaction of hydroxyl group-containing silicone resins and epichlorohydrin. Among these epoxy resins, biphenyl aralkyl-based epoxy resins, naphthylene ether-based epoxy resins, polyfunctional phenol-based epoxy resins, and naphthalene-based epoxy resins are preferred in terms of flame retardancy and heat resistance. The above preferred epoxy resins can also be obtained as commercial products, and "HP6000" (polyoxynaphthylene-based epoxy resin) manufactured by DIC and "EPPN-501HY" (trisphenol-based epoxy resin) manufactured by Nippon Kayaku Co., Ltd. are preferred. One of these epoxy resins can be used alone, or two or more of these epoxy resins can be used in combination.

The epoxy equivalent weight of the epoxy resin (C) in the present embodiment is preferably 250 to 850 g/eq, more preferably 250 to 450 g/eq, from the viewpoint of making adhesion and flexibility better. The above epoxy equivalent weight can be measured by an ordinary method.

The content of the epoxy resin (C) in the present embodiment is not particularly limited but is preferably 1 to 90 parts by mass, more preferably 3 to 80 parts by mass, based on 100 parts by mass of the resin solid component in the resin composition. When the content of the epoxy resin is in the above range, the adhesion, the flexibility, and the like tend to be better.

The resin composition in the present embodiment comprises the cyanate compound (A) and the maleimide compound (B) and/or the epoxy resin (C), and preferably comprises the cyanate compound (A), the maleimide compound (B), and the epoxy resin (C) from the viewpoint of heat resistance, combustion resistance, mechanical properties, long-term heat resistance, chemical resistance, and electrical insulation properties.

[Primary hexagonal boron nitride particles (D)]

The primary hexagonal boron nitride particles (D) in the present embodiment have an average aspect ratio of 4 to 10.

Because of such an average aspect ratio, the resin composition in the present embodiment has sufficient thermal conductivity and can exhibit excellent peel strength and moisture absorption heat resistance. From a similar viewpoint, the above average aspect ratio is preferably 5 to 10. The above average aspect ratio can be calculated as the average value of major axis/minor axis by measuring the lengths of the major axis and the minor axis for each of the primary hexagonal boron nitride particles. Specific examples of the primary hexagonal boron nitride particles (D) satisfying the above average aspect ratio include, but are not limited to, "πBN-S03" manufactured by Tokuyama Corporation.

The particle shape of the primary hexagonal boron nitride particles (D) in the present embodiment is not particularly limited. Examples thereof include a scale-like shape, a flat shape, a granular shape, a spherical shape, a fibrous shape, and a whisker-like shape. Among them, a scale-like shape is preferred.

The average particle diameter of the primary hexagonal boron nitride particles is not particularly limited, but the median diameter is preferably 0.1 to 50 μm, more preferably 0.1 to 45 μm, and further preferably 0.1 to 40 μm. The median diameter is a value at which the larger side and the smaller side when the measured particle size distribution of a powder is divided into two are equivalent. More specifically, the median diameter means a value when the particle size distribution of a powder introduced in a predetermined amount into an aqueous dispersion medium is measured by a wet laser diffraction-scattering particle size distribution measuring apparatus, the volumes are summed from a small particle, and 50% of the total volume is reached. When the average particle diameter is in the above range, the physical property balance of thermal conductivity, peel strength, and moisture absorption heat resistance tends to be better.

The resin composition in the present embodiment may comprise various known inorganic fillers in addition to the above-described primary hexagonal boron nitride particles (D). Such an inorganic filler is not particularly limited as long as it has insulation properties. Examples of the inorganic filler include silicas such as natural silica, fused silica, amorphous silica, and hollow silica, alumina, aluminum nitride, boron nitride (excluding the primary hexagonal boron nitride particles (D) in the present embodiment; the same applies below), boehmite, molybdenum oxide, titanium oxide, silicone rubbers, silicone composite powders, zinc borate, zinc stannate, clay, kaolin, talc, calcined clay, calcined kaolin, calcined talc, mica, glass short fibers (fine powders of glass such as E glass and D glass), hollow glass, and spherical glass. One of these may be used alone, or two or more of these may be used in combination.

Among the above, the resin composition in the present embodiment preferably comprises at least one selected from the group consisting of silica, alumina, aluminum nitride, and boron nitride. Particularly, silica is preferred from the viewpoint of low thermal expansion, and alumina, aluminum nitride, and boron nitride are preferred from the viewpoint of high thermal conductivity.

In the resin composition in the present embodiment, a silane coupling agent, a wetting and dispersing agent, and the like as components other than the inorganic filler can also be used in combination with the primary hexagonal boron nitride particles (D) in order to improve the dispersibility of the fine particles and the adhesive strength between the resins and the fine particles or a glass cloth.

The silane coupling agent is not particularly limited as long as it is a silane coupling agent generally used for surface treatment of inorganic matter. Specific examples include aminosilane-based silane coupling agents such as γ-aminopropyltriethoxysilane and N-β-(aminoethyl)-γ-aminopropyltrimethoxysilane; epoxysilane-based silane coupling agents such as γ-glycidoxypropyltrimethoxysilane; acrylic silane-based silane coupling agents such as γ-acryloxypropyltrimethoxysilane; cationic silane-based silane coupling agents such as N-β-(N-vinylbenzylaminoethyl)-γ-aminopropyltrimethoxysilane hydrochloride; phenylsilane-based silane coupling agents; and styrylsilane-based coupling agents such as p-styryltrimethoxysilane, p-styryltriethoxysilane, p-styrylmethyldimethoxysilane, p-styrylmethyldiethoxysilane, and N-(vinylbenzyl)-2-aminoethyl-3-aminopropyltrimethoxysilane hydrochloride. One of these may be used alone, or two or more of these may be used in combination.

The wetting and dispersing agent is not particularly limited as long as it is a dispersion stabilizer used for a paint. Examples of the wetting and dispersing agent include wetting and dispersing agents such as "DISPERBYK-110", "DISPERBYK-111", "DISPERBYK-118", "DISPERBYK-180", "DISPERBYK-161", "BYK-W996", "BYK-W9010", and "BYK-W903" manufactured by BYK Japan KK. One of these may be used alone, or two or more of these may be used in combination.

The total amount of the primary hexagonal boron nitride particles (D) and the inorganic filler in the resin composition in the present embodiment is not particularly limited but is preferably 50 to 1600 parts by mass, more preferably 50 to 1500 parts by mass, and further preferably 301 to 700 parts by mass, based on 100 parts by mass of the resin solid component. A case where the total amount of the primary hexagonal boron nitride particles (D) and the inorganic filler is in the above range is preferred from the viewpoint of characteristics such as peel strength, moisture absorption heat resistance, low thermal expansion, and high thermal conduction. From a similar viewpoint, the content of the primary hexagonal boron nitride particles (D) in the resin composition in the present embodiment is preferably 50 to 1600 parts by mass, more preferably 50 to 1500 parts by mass, and further preferably 50 to 700 parts by mass, based on 100 parts by mass of the resin solid component.

[Other Components]

The resin composition in the present embodiment can comprise other components in addition to the above-described components in a range in which the desired characteristics in the present embodiment are not impaired. In the present embodiment, from the viewpoint of more improving various physical properties, the resin composition preferably further comprises one or more selected from the group consisting of an oxetane resin, a phenolic resin, a benzoxazine compound, and a compound having a polymerizable unsaturated group. Specific examples of a cyanate compound other than the cyanate compound (A) represented by formula (1) are not particularly limited. The cyanate compounds are illustrated as described above.

(Oxetane Resin)

The resin composition in the present embodiment tends to have better adhesion, flexibility, and the like by comprising an oxetane resin. As the oxetane resin, those generally known can be used, and the type of the oxetane resin is not particularly limited. Specific examples thereof include oxetane, alkyloxetanes such as 2-methyloxetane, 2,2-dimethyloxetane, 3-methyloxetane, and 3,3-dimethyloxetane, 3-methyl-3-methoxymethyloxetane, 3,3'-di(trifluoromethyl) perfluoxetane, 2-chloromethyloxetane, 3,3-bis(chloromethyl)oxetane, biphenyl-based oxetane, OXT-101 (trade name manufactured by Toagosei Co., Ltd.), and OXT-121 (trade name manufactured by Toagosei Co., Ltd.). One of these oxetane resins can be used alone, or two or more of these oxetane resins can be used in combination.

The content of the oxetane resin is not particularly limited but is preferably 0 to 99 parts by mass, more preferably 1 to 90 parts by mass, and further preferably 3 to 80 parts by mass, based on 100 parts by mass of the resin solid component in the resin composition. When the content of the oxetane resin is in the above range, the adhesiveness, the flexibility, and the like tend to be better.

(Phenolic Resin)

The resin composition in the present embodiment tends to have better adhesion, flexibility, and the like by comprising a phenolic resin. As the phenolic resin, those generally known can be used as long as they are phenolic resins having two or more hydroxyl groups in one molecule. The type of the phenolic resin is not particularly limited. Specific examples thereof include bisphenol A-based phenolic resins, bisphenol E-based phenolic resins, bisphenol F-based phenolic resins, bisphenol S-based phenolic resins, phenol novolac resins, bisphenol A novolac-based phenolic resins, glycidyl ester-based phenolic resins, aralkyl novolac-based phenolic resins, biphenyl aralkyl-based phenolic resins, cresol novolac-based phenolic resins, polyfunctional phenolic resins, naphthol resins, naphthol novolac resins, polyfunctional naphthol resins, anthracene-based phenolic resins, naphthalene skeleton-modified novolac-based phenolic resins, phenol aralkyl-based phenolic resins, naphthol aralkyl-based phenolic resins, dicyclopentadiene-based phenolic resins, biphenyl-based phenolic resins, alicyclic phenolic resins, polyol-based phenolic resins, phosphorus-containing phenolic resins, and hydroxyl group-containing silicone resins but are not particularly limited. One of these phenolic resins can be used alone, or two or more of these phenolic resins can be used in combination.

The content of the phenolic resin is not particularly limited but is preferably 0 to 99 parts by mass, more preferably 1 to 90 parts by mass, and further preferably 3 to 80 parts by mass, based on 100 parts by mass of the resin solid component in the resin composition. When the content of the phenolic resin is in the above range, the adhesion, the flexibility, and the like tend to be better.

(Benzoxazine Compound)

The resin composition in the present embodiment tends to have better flame retardancy, heat resistance, low water absorbency, low dielectricity, and the like by comprising a benzoxazine compound. As the benzoxazine compound, those generally known can be used as long as they are compounds having two or more dihydrobenzoxazine rings in one molecule. The type of the benzoxazine compound is not particularly limited. Specific examples thereof include bisphenol A-based benzoxazine BA-BXZ (trade name manufactured by Konishi Chemical Ind. Co., Ltd.) bisphenol F-based benzoxazine BF-BXZ (trade name manufactured by Konishi Chemical Ind. Co., Ltd.), and bisphenol S-based benzoxazine BS-BXZ (trade name manufactured by Konishi Chemical Ind. Co., Ltd.). One of these benzoxazine compounds can be used alone, or two or more of these benzoxazine compounds can be mixed and used.

The content of the benzoxazine compound is not particularly limited but is preferably 0 to 99 parts by mass, more preferably 1 to 90 parts by mass, and further preferably 3 to 80 parts by mass, based on 100 parts by mass of the resin solid component in the resin composition. When the content of the benzoxazine compound is in the above range, the heat resistance and the like tend to be better.

(Compound Having Polymerizable Unsaturated Group)

The resin composition in the present embodiment tends to have better heat resistance, toughness, and the like by comprising a compound having a polymerizable unsaturated group. As the compound having a polymerizable unsaturated group, those generally known can be used, and the type of the compound having a polymerizable unsaturated group is not particularly limited. Specific examples thereof include vinyl compounds such as ethylene, propylene, styrene, divinylbenzene, and divinylbiphenyl; (meth)acrylates of monohydric or polyhydric alcohols such as methyl (meth)acrylate, 2-hydroxyethyl (meth)acrylate, 2-hydroxypropyl (meth)acrylate, polypropylene glycol di(meth)acrylate, trimethylolpropane di(meth)acrylate, trimethylolpropane tri(meth)acrylate, pentaerythritol tetra(meth)acrylate, and dipentaerythritol hexa(meth)acrylate; epoxy (meth)acrylates such as bisphenol A-based epoxy (meth)acrylate and bisphenol F-based epoxy (meth)acrylate; benzocyclobutene resins; and (bis)maleimide resins. One of these compounds having an unsaturated group can be used alone, or two or more of these compounds having an unsaturated group can be mixed and used.

The content of the compound having a polymerizable unsaturated group is not particularly limited but is preferably 0 to 99 parts by mass, more preferably 1 to 90 parts by mass, and further preferably 3 to 80 parts by mass, based on 100 parts by mass of the resin solid component in the resin composition. When the content of the compound having a polymerizable unsaturated group is in the above range, the heat resistance, the toughness, and the like tend to be better.

(Polymerization Catalyst and Curing Accelerator)

In addition to the above-described compounds or resins, a polymerization catalyst for catalyzing polymerization of the cyanate compound, the epoxy resin, the oxetane resin, and the compound having a polymerizable unsaturated group, and/or a curing accelerator for appropriately adjusting the curing rate can be further blended in the resin composition in the present embodiment. As the polymerization catalyst and/or the curing accelerator, those generally known can be used, and the type of the polymerization catalyst and/or the curing accelerator is not particularly limited. Specific examples thereof include metal salts such as zinc octylate, zinc naphthenate, cobalt naphthenate, copper naphthenate, and acetylacetone iron; organometallic salts such as nickel octylate and manganese octylate; phenol compounds such as phenol, xylenol, cresol, resorcin, catechol, octyl phenol, and nonyl phenol; alcohols such as 1-butanol and 2-ethylhexanol; imidazole derivatives such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, and 2-phenyl-4-methyl-5-hydroxymethylimidazole; derivatives such as adducts of carboxylic acids of these imidazoles or acid anhydrides thereof; amine compounds such as dicyandiamide, benzyldimethylamine, and 4-methyl-N,N-dimethylbenzylamine; phosphorus compounds such as phosphine-based compounds, phosphine oxide-based compounds, phosphonium-based compounds, and diphosphine-based compounds; epoxy-imidazole adduct-based compounds, peroxides such as benzoyl peroxide, p-chlorobenzoyl peroxide, di-t-butyl peroxide, diisopropyl peroxycarbonate, and di-2-ethylhexyl peroxycarbonate; and azo compounds such as azobisisobutyronitrile. For these catalysts, commercial ones may be used. Examples thereof include AJICURE PN-23 (manufactured by Ajinomoto Fine-Techno Co., Inc.), NOVACURE HX-3721 (manufactured by Asahi Kasei Corporation), and Fujicure FX-1000 (manufactured by FUJI KASEI KOGYO CO., LTD.). One of these polymerization catalysts and/or curing accelerators can be used, or two or more of these polymerization catalysts and/or curing accelerators can be mixed and used.

The content of the polymerization catalyst and the curing accelerator can be appropriately adjusted considering the degrees of cure of the resins, the viscosity of the resin composition, and the like and is not particularly limited but is usually preferably 0.005 to 10 parts by mass based on 100 parts by mass of the resin solid component in the resin composition.

(Other Additives)

Further, the resin composition in the present embodiment may contain various polymer compounds such as another thermosetting resin, a thermoplastic resin and an oligomer thereof, and an elastomer, and known additives such as a curing catalyst, a curing accelerator, a coloring pigment, a defoaming agent, a surface-adjusting agent, a flame retardant, a solvent, an ultraviolet absorbing agent, an antioxidant, a photopolymerization initiator, a fluorescent brightening agent, a photosensitizer, a dye, a pigment, a thickening agent, a lubricant, a flow-adjusting agent, a dispersing agent, a leveling agent, a brightening agent, a polymerization inhibitor, and a silane coupling agent, as needed. In addition, the resin composition in the present embodiment may contain a solvent as needed. One of these optional additives can be used, or two or more of these optional additives can be mixed and used.

As the flame retardant, those generally known can be used, and the type of the flame retardant is not particularly limited. Specific examples thereof include bromine compounds such as 4,4'-dibromobiphenyl; phosphates, melamine phosphate, phosphorus-containing epoxy resins, nitrogen compounds such as melamine and benzoguanamine; oxazine ring-containing compounds, and silicone-based compounds.

An organic solvent can be used in the resin composition according to the present embodiment as needed. In this case, the resin composition in the present embodiment can be used as a form (solution or varnish) in which at least some, preferably all, of the above-described various resin components are dissolved in or compatible with the organic solvent.

As the solvent, those generally known can be used as long as they can dissolve or be compatible with at least some, preferably all, of the above-described various resin components. The solvent is not particularly limited. Specific examples thereof include ketone-based solvents such as acetone, methyl ethyl ketone, methyl isobutyl ketone, and cyclohexanone; cellosolve-based solvents such as propylene glycol monomethyl ether and propylene glycol monomethyl ether acetate; ester-based solvents such as methyl lactate, methyl acetate, ethyl acetate, butyl acetate, isoamyl acetate, ethyl lactate, methyl methoxypropionate, and methyl hydroxyisobutyrate; polar solvents such as amides such as dimethylacetamide and dimethylformamide; alcohol-based solvents such as methanol, ethanol, isopropanol, and 1-ethoxy-2-propanol; and aromatic hydrocarbons such as toluene, xylene, and anisole. One of these solvents can be used, or two or more of these solvents can be mixed and used.

[Method for Producing Resin Composition]

The resin composition in the present embodiment can be prepared according to an ordinary method. For example, a method in which a resin composition uniformly containing the cyanate compound (A), the maleimide compound (B) and/or the epoxy resin (C), the primary hexagonal boron nitride particles (D), and the above-described other optional components is obtained is preferred. Specifically, for example, the resin composition in the present embodiment can be easily prepared by sequentially blending the components with a solvent and sufficiently stirring the blend.

During preparation of the resin composition in the present embodiment, an organic solvent can be used as needed. The type of the organic solvent is not particularly limited as long as it can dissolve the resins in the resin composition. Specific examples thereof are as described above.

During preparation of the resin composition, known treatment (stirring, mixing, and kneading treatment and the like) for uniformly dissolving or dispersing the components can be performed. For example, in uniform dispersion of the primary hexagonal boron nitride particles (D) and the inorganic filler, by performing stirring and dispersion treatment using a stirring vessel provided with a stirrer having suitable stirring ability, the dispersibility in the resin composition is increased. The above stirring, mixing, and kneading treatment can be appropriately performed, for example, using a known apparatus such as an apparatus intended for mixing such as a ball mill or a bead mill, or a revolution or rotation mixing apparatus.

The resin composition for printed circuit boards in the present embodiment can be used as constituent materials for a prepreg, a metal foil-clad laminate, a printed circuit board, and a semiconductor package. For example, a prepreg can be obtained by impregnating or coating a base material with a solution of the resin composition for printed circuit boards in the present embodiment dissolved in a solvent and drying the solution.

In addition, a buildup film or a dry film solder resist can be obtained by using a peelable plastic film as a base material, coating the plastic film with a solution of the resin composition for printed circuit boards in the present embodiment dissolved in a solvent, and drying the solution. Here, the solvent can be dried by drying at a temperature of 20° C. to 150° C. for 1 to 90 minutes.

In addition, the resin composition for printed circuit boards in the present embodiment can also be used in an uncured state in which the solvent is only dried, or in a semi-cured (B-staged) state as needed.

A prepreg in the present embodiment will be described in detail below. The prepreg in the present embodiment comprises a base material; and the above resin composition with which the base material is impregnated or coated. The method for producing the prepreg in the present embodiment is not particularly limited as long as it is a method of combining the resin composition for printed circuit boards in the present embodiment and a base material to produce a prepreg. Specifically, the prepreg in the present embodiment can be produced by impregnating or coating a base material with the resin composition for printed circuit boards in the present embodiment and then semi-curing the resin composition by a method of drying in a dryer at 120 to 220° C. for about 2 to 15 minutes, or the like. At this time, the amount of the resin composition adhered to the base material, that is, the content of the resin composition (including the primary hexagonal boron nitride particles (D) and the inorganic filler) based on the total amount of the prepreg after the semi-curing, is preferably in the range of 20 to 99% by mass.

The base material used when the prepreg in the present embodiment is produced may be a known one used for various printed circuit board materials. Examples of such a base material include, but are not particularly limited to, woven fabrics of fibers of glass such as E glass, D glass, L glass, S glass, T glass, Q glass, UN glass, NE glass, and spherical glass, inorganic fibers of materials other than glass, such as quartz, organic fibers of polyimides, polyamides, polyesters, and the like, liquid crystal polyesters, and the like. As the shape of the base material, woven fabrics, nonwoven fabrics, rovings, chopped strand mats, surfacing mats, and the like are known, and the shape of the base material may be any of these. One of these base materials can be used alone, or two or more of these base materials can be used in appropriate combination. Among woven fabrics, particularly, woven fabrics subjected to ultra-opening treatment or clogging treatment are preferred from the viewpoint of dimensional stability. Further, glass woven fabrics surface-treated with silane coupling agents for epoxysilane treatment, aminosilane treatment, or the like are preferred from the viewpoint of moisture absorption heat resistance. In addition, liquid crystal polyester woven fabrics are preferred in terms of electrical characteristics. Further, the thickness of the base material is not particularly limited, but is preferably in the range of 0.01 to 0.2 mm in laminate applications.

A metal foil-clad laminate in the present embodiment comprises at least one or more of the above-described prepregs laminated; and metal foil disposed on one surface or both surfaces of the prepreg. Specifically, the metal foil-clad laminate in the present embodiment can be fabricated by disposing foil of a metal such as copper or aluminum on one surface or both surfaces of one of the above-described prepreg or a stack of a plurality of the prepregs and laminate-molding the metal foil and the prepreg or the stack. The metal foil used here is not particularly limited as long as it is one used for a printed circuit board material. Copper foil such as rolled copper foil and electrolytic copper foil is preferred. In addition, the thickness of the metal foil is not particularly limited but is preferably 2 to 70 µm, more preferably 3 to 35 µm. As the molding conditions, methods used when usual laminates and multilayer boards for printed circuit boards are fabricated can be adopted. For example, the metal foil-clad laminate in the present embodiment can be produced by laminate-molding under the conditions of a temperature of 180 to 350° C., a heating time of 100 to 300 minutes, and a surface pressure of 20 to 100 kg/cm$^2$ using a multistage press, a multistage vacuum press, a continuous molding machine, an autoclave molding machine, or the like. In addition, a multilayer board can also be fabricated by laminate-molding the above prepreg and a separately fabricated wiring board for an inner layer in combination. As the method for producing a multilayer board, for example, 35 µm copper foil is disposed on both surfaces of one of the above-described prepreg, the copper foil and the prepreg are laminated and formed under the above conditions, then inner layer circuits are formed, and these circuits are subjected to blackening treatment to form an inner layer circuit board. Further, these inner layer circuit boards and the above prepregs are alternately disposed one by one, copper foil is further disposed on the outermost layers, and the copper foil, the inner layer circuit boards, and the prepregs are laminate-molded under the above conditions preferably under vacuum. Thus, a multilayer board can be fabricated.

The metal foil-clad laminate in the present embodiment can be preferably used as a printed circuit board by further forming a pattern. The printed circuit board can be produced according to an ordinary method, and the method for producing the printed circuit board is not particularly limited. One example of a method for producing a printed circuit board will be shown below. First, the above-described metal foil-clad laminate is provided. Next, the surfaces of the metal foil-clad laminate are subjected to etching treatment to form inner layer circuits to fabricate an inner layer board. The inner layer circuit surfaces of this inner layer board are subjected to surface treatment for increasing adhesive strength, as needed, and then the required number of the above-described prepregs are stacked on the inner layer circuit surfaces. Further, metal foil for outer layer circuits is laminated on the outside of the stack, and heat and pressure are applied for integral molding. In this manner, a multilayer laminate in which insulating layers comprising a base material and a cured product of a resin composition for printed circuit boards are formed between inner layer circuits and metal foil for outer layer circuits is produced. Then, this multilayer laminate is subjected to perforation for through holes and via holes, and then plating metal films that allow conduction between the inner layer circuits and the metal foil for outer layer circuits are formed on the wall surfaces of these holes. Further, the metal foil for outer layer circuits is subjected to etching treatment to form outer layer circuits. Thus, a printed circuit board is produced.

The printed circuit board obtained in the above production example has a configuration in which it has insulating layers and conductor layers formed on surfaces of these insulating layers, and the insulating layers comprise the resin composition for printed circuit boards in the present embodiment described above. In other words, the prepreg in the present embodiment described above (the base material and the resin composition for printed circuit boards in the present embodiment with which the base material is impregnated or coated) and the layer of the resin composition for printed circuit boards of the metal foil-clad laminate in the present embodiment described above (the layer comprising the resin composition for printed circuit boards in the present embodiment) are composed of an insulating layer comprising the resin composition for printed circuit boards in the present embodiment.

A resin sheet in the present embodiment refers to a support and the above resin composition layer disposed on a surface of the support (laminated sheet) and also refers to only the resin composition layer obtained by removing the support (single-layer sheet). This laminated sheet can be obtained by coating a support with a solution of the above resin composition dissolved in a solvent and drying the solution. The support used here is not particularly limited. Examples thereof include organic film base materials such as polyethylene films, polypropylene films, polycarbonate films, polyethylene terephthalate films, ethylene-tetrafluoroethylene copolymer films, and release films obtained by coating surfaces of these films with release agents, and polyimide films, conductor foil such as copper foil and aluminum foil, and plate-shaped inorganic films such as glass plates, SUS plates, and FRP. Examples of the coating method include a method of fabricating a laminated sheet in which a support and a resin composition layer are integrated, by coating a support with a solution of the above resin composition dissolved in a solvent by a bar coater, a die coater, a doctor blade, a baker applicator, or the like. In addition, a single-layer sheet can also be obtained by peeling or etching the support from the resin sheet obtained by further drying after the coating. A single-layer sheet can also be obtained without using a support by supplying a solution of the above resin composition for printed circuit boards in the present embodiment dissolved in or made compatible with a solvent into a mold having a sheet-shaped cavity, and drying the solution, or the like for molding into a sheet shape.

In fabrication of the resin sheet or the single-layer sheet in the present embodiment, the drying conditions when the solvent is removed are not particularly limited, but drying is preferably performed at a temperature of 20° C. to 200° C. for 1 to 90 minutes. At 20° C. or more, remaining of the solvent in the resin composition can be more prevented, and at 200° C. or less, progress of curing of the resin composition can be suppressed. In addition, the thickness of the resin layer in the resin sheet or the single-layer sheet in the present embodiment can be adjusted by the concentration and coating thickness of the solution of the resin composition for printed circuit boards in the present embodiment and is not particularly limited. However, the thickness is preferably 0.1 to 500 μm. When the thickness of the resin layer is 500 μm or less, the solvent is even less likely to remain during drying.

EXAMPLES

The present embodiment will be more specifically described below using an Example and a Comparative Example. The present embodiment is not limited in any way by the following Example.

(Synthesis Example 1) Synthesis of 1-Naphthol Aralkyl-Based Cyanate Resin (SNCN)

300 g (1.28 mol in terms of OH groups) of an α-naphthol aralkyl resin (SN495V, OH group equivalent: 236 g/eq., manufactured by Nippon Steel Chemical Co., Ltd.) and 194.6 g (1.92 mol) (1.5 mol based on 1 mol of hydroxy groups) of triethylamine were dissolved in 1800 g of dichloromethane in a reactor, and this solution was a solution 1.

While 125.9 g (2.05 mol) (1.6 mol based on 1 mol of hydroxy groups) of cyanogen chloride, 293.8 g of dichloromethane, 194.5 g (1.92 mol) (1.5 mol based on 1 mol of hydroxy groups) of 36% hydrochloric acid, and 1205.9 g of water were kept at a liquid temperature of −2 to −0.5° C. under stirring, the solution 1 was poured over 30 minutes. After completion of pouring of the solution 1, the mixture was stirred at the same temperature for 30 minutes, and then a solution of 65 g (0.64 mol) (0.5 mol based on 1 mol of hydroxy groups) of triethylamine dissolved in 65 g of dichloromethane (solution 2) was poured over 10 minutes. After completion of pouring of the solution 2, the mixture was stirred at the same temperature for 30 minutes to complete the reaction.

Then, the reaction liquid was allowed to stand to separate the organic phase and the aqueous phase. The obtained organic phase was washed five times with 1300 g of water. The electrical conductivity of the wastewater from the fifth water washing was 5 μS/cm, and it was confirmed that removable ionic compounds were sufficiently removed by the washing with water.

The organic phase after the water washing was concentrated under reduced pressure and finally concentrated to dryness at 90° C. for 1 hour to obtain 331 g of the target naphthol aralkyl-based cyanate compound (SNCN) (orange viscous material). The mass average molecular weight Mw of the obtained SNCN was 600. In addition, the infrared absorption spectrum of SNCN showed absorption at 2250 $cm^{-1}$ (cyanate groups) and showed no absorption of hydroxy groups.

(Method for Measuring Average Aspect Ratio)

The average aspect ratio was measured based on an image obtained by observing primary hexagonal boron nitride particles using an scanning electron microscope (SEM). In other words, the lengths of the major axis and the minor axis were measured for 50 primary hexagonal boron nitride particles present in a predetermined field of view, and the average aspect ratio was calculated as the average value of major axis/minor axis.

Example 1

30 parts by mass of the SNCN (cyanate equivalent: 256 g/eq.) obtained by Synthesis Example 1, as a cyanate compound (A); 15 parts by mass of bis(3-ethyl-5-methyl-4-maleimidophenyl)methane (BMI-70, manufactured by Daiwa Kasei Co., Ltd., maleimide equivalent: 221 g/eq.) and 15 parts by mass of a novolac-based bismaleimide compound (manufactured by Daiwa Kasei Co., Ltd., BMI-2300) as maleimide compounds (B); 35.3 parts by mass of a polyoxynaphthylene-based epoxy resin ("HP6000" manufactured by DIC, epoxy equivalent weight: 169 g/eq.) and 4.7 parts by mass of a trisphenol-based epoxy resin ("EPPN-501HY" manufactured by Nippon Kayaku Co., Ltd., epoxy equivalent weight: 169 g/eq.) as epoxy resins (C); 60 parts by mass of "πBN-S03" (average particle diameter 11 μm) manufactured by Tokuyama Corporation, as primary hexagonal boron nitride particles (D); 5.0 parts by mass of a dispersing agent comprising an acid group (manufactured by BYK Japan KK, "BYK-W903"); 15.0 parts by mass of an epoxy-based silane coupling agent ("Z6040" manufactured by Dow Corning Toray Co., Ltd.); 1.0 part by mass of a dispersing agent (manufactured by BYK Japan KK, "DISPERBYK-161"); 1.0 part by mass of a wetting and dispersing agent 1 (manufactured by BYK Japan KK, "BYK-111"); 0.3 parts by mass of a wetting and dispersing agent 2 (manufactured by BYK Japan KK, "BYK-2009"); 0.50 parts by mass of 2,4,5-triphenylimidazole (manufactured by TOKYO CHEMICAL INDUSTRY CO., LTD., curing accelerator); and 0.01 parts by mass of zinc octylate (manufactured by Nihon Kagaku Sangyo Co., Ltd., trademark NIKKA OCTHIX Zinc) were added, mixed, and diluted with methyl ethyl ketone to obtain a resin varnish. The average aspect ratio of πBN-S03 calculated based on the above-described method was 5.8.

Comparative Example 1

A resin varnish was obtained as in Example 1 except that 60 parts by mass of "RBN" (average particle diameter 2 μm) manufactured by Nissin Refratech Co., LTD. was blended as the primary hexagonal boron nitride particles (D) instead of "πBN-S03". The average aspect ratio of RBN calculated based on the above-described method was 2.5.

Comparative Example 2

A resin varnish was obtained as in Example 1 except that 60 parts by mass of aggregates obtained by subjecting "BTBN009" manufactured by Ben Tree to aggregation treatment to an average particle diameter of 9 μm was blended as the primary hexagonal boron nitride particles (D) instead of "7πBN-S03". The average aspect ratio of the BTBN009 aggregates calculated based on the above-described method was 12.1.

[Method for Producing Copper-Clad Laminate]

E-glass clothes having a thickness of 0.1 mm were impregnated and coated with the resin varnishes of Example 1 and Comparative Examples 1 to 2 obtained as described above, and heated and dried at 150° C. for 5 minutes using a dryer (pressure-resistant explosion-proof steam dryer, manufactured by TAKASUGI MFG. Co. Ltd.)), to obtain each prepreg comprising 50% by mass of a resin composition. Two or eight of these prepregs were stacked, and 12 μm thick electrolytic copper foil (3EC-M3-VLP, manufactured by MITSUI MINING & SMELTING CO., LTD.) was disposed on both surfaces. The stack was vacuum-pressed at a pressure of 30 kg/cm² and a temperature of 220° C. for 150 minutes to obtain a copper-clad laminate having an insulating layer thickness of 0.2 mm or 0.8 mm. Evaluation of the following characteristics was performed using the obtained copper-clad laminate. The results are shown together in Table 1.

<Methods for Evaluating Characteristics>
(1) Thermal Conductivity

All copper foil on both surfaces of the double-sided copper-clad laminate having an insulating layer thickness of 0.8 mm was removed by etching, and then the resultant was cut out into a test piece (10 mm×10 mm×1 mm thick). For this test piece, the thermal conductivity was measured by a laser flash using a xenon flash analyzer LFA447 thermal conductivity meter manufactured by NETZSCH. The thermal conductivity for the Example and the Comparative Examples was evaluated on a scale of 1 to 3 based on the following criteria:
⊚: more than 1.00 W/mk
○: 0.75 W/mk or more and 1.00 W/mk or less
×: less than 0.75 W/mk (2) Copper Foil Peel Strength The copper foil peel strength was measured three times in accordance with JIS C6481, Test methods of copper-clad laminates for printed circuit boards (see 5.7 Peel Strength), using a test piece (30 mm×150 mm×0.8 mm thick) of the double-sided copper-clad laminate having an insulating layer thickness of 0.8 mm, and the average value of the lower limit values was the measured value.

(3) Moisture Absorption Heat Resistance

All copper foil except half of copper foil on one surface of a double-sided copper-clad laminate (50 mm×50 mm×insulating layer thickness 0.8 mm) was removed by etching to obtain a test piece. The obtained test piece was treated at 121° C. and 2 atmospheres by a pressure cooker tester (manufactured by HIRAYAMA MANUFACTURING CORPORATION, model PC-3) for 5 hours and then immersed in solder at 260° C. for 60 seconds. Each of three samples was subjected to the above test, and the presence or absence of blisters after the immersion was visually observed for each sample. One without abnormality was described as "○", and one in which blisters occurred was described as "×". For example, a case where blisters occurred in all three samples was described as "×××", and a case where blisters occurred in two of three samples was described as "○××".

TABLE 1

|  |  | Example 1 | Comparative Example 1 | Comparative Example 2 |
|---|---|---|---|---|
| Average aspect ratio (major axis/minor axis) | | 5.8 | 2.5 | 12.1 |
| Thermal conductivity | Z-axis 25 deg. C. | ○ | X | ○ |
| | XY-axis 25 deg. C. | ⊚ | Δ | ⊚ |
| Copper foil peel strength | 0.8 kgf/mmt cm | 0.85 | 0.62 | 0.35 |
| Moisture absorption heat resistance | 5 h | ○○× | ××× | ××× |

This application is based on Japanese Patent Application No. 2017-020525 filed on Feb. 7, 2017, the contents of which are incorporated herein by reference.

INDUSTRIAL APPLICABILITY

The resin composition of the present invention has industrial applicability as materials for a prepreg, a metal foil-clad laminate, a laminated resin sheet, a resin sheet, a printed circuit board, and the like.

The invention claimed is:

1. A resin composition comprising:
a cyanate compound (A);
a maleimide compound (B);
an epoxy resin (C);
primary hexagonal boron nitride particles (D) having an average aspect ratio of 4 to 10; and
a second boron nitride other than the primary hexagonal boron nitride particles (D), and
optionally comprising an inorganic filler other than the primary hexagonal boron nitride particles (D) and the second boron nitride,
wherein the cyanate compound (A) comprises a naphthol aralkyl-based cyanate compound represented by the following formula (A-1),

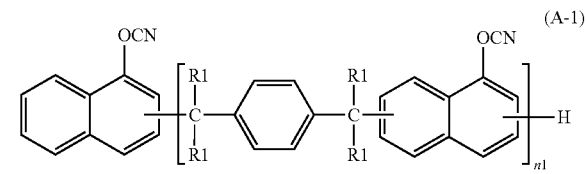

wherein R1 each independently represents a hydrogen atom or a methyl group, and n1 represents an integer of 1 to 50,
the maleimide compound (B) comprises bis(3-ethyl-5-methyl-4-maleimidophenyl)methane and a maleimide compound represented by the following formula (B-1),

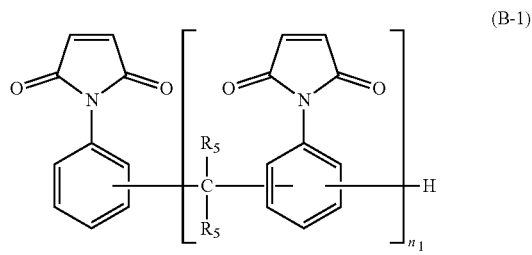

wherein $R_5$ each independently represents a hydrogen atom or a methyl group, and $n_1$ represents an integer of 1 or more,
the epoxy resin (C) comprises a polyoxynaphthylene-based epoxy resin and a trisphenol-based epoxy resin,
a content of the cyanate compound (A) is 10 to 80 parts by mass based on 100 parts by mass of the resin solid component, a content of the maleimide compound (B) is 10 to 80 parts by mass based on 100 parts by mass of the resin solid component, a content of the epoxy resin (C) is 3 to 80 parts by mass based on 100 parts by mass of the resin solid component, and a content of the primary hexagonal boron nitride particles (D) is 50 parts by mass or more based on 100 parts by mass of the resin solid component, provided that a total amount of the primary hexagonal boron nitride particles (D), the second boron nitride, and the inorganic filler is 301 parts by mass or less based on 100 parts by mass of the resin solid component.

2. The resin composition according to claim 1, wherein the cyanate compound (A) further comprises at least one selected from a group consisting of a phenol novolac-based cyanate compound and a biphenyl aralkyl-based cyanate compound represented by the following formula (A-2), (A-2)

wherein R3 each independently represents a hydrogen atom or a methyl group, and n3 represents an integer of 1 to 50.

3. The resin composition according to claim 1, wherein the epoxy resin (C) further comprises at least one selected from a group consisting of a biphenyl aralkyl-based epoxy resin, a naphthylene ether-based epoxy resin, a polyfunctional phenol-based epoxy resin, and a naphthalene-based epoxy resin.

4. The resin composition according to claim 1, further comprising at least one selected from a group consisting of a phenolic resin, an oxetane resin, a benzoxazine compound, and a compound having a polymerizable unsaturated group.

5. The resin composition according to claim 1, wherein the maleimide compound (B) further comprises at least one selected from a group consisting of 2,2'-bis{4-(4-maleimidophenoxy)-phenyl}propane and a maleimide compound represented by the following formula (B-2),

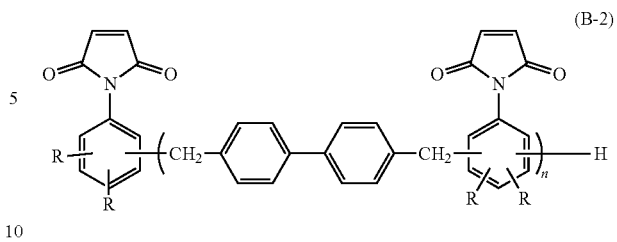

wherein a plurality of R each independently represent a hydrogen atom, an alkyl group having 1 to 5 carbon atoms, or a phenyl group, and n is an average value and represents $1 < n \leq 5$.

6. The resin composition according to claim 5, wherein the maleimide compound (B) further comprises a maleimide compound represented by the following formula (B-2), (B-2)

wherein a plurality of R each independently represent a hydrogen atom, an alkyl group having 1 to 5 carbon atoms, or a phenyl group, and n is an average value and represents $1 < n \leq 5$.

7. The resin composition according to claim 1, wherein an epoxy equivalent weight of the epoxy resin (C) is 250 to 850 g/eq.

8. The resin composition according to claim 7, wherein an epoxy equivalent weight of the epoxy resin (C) is 250 to 450 g/eq.

9. A prepreg comprising:
a base material; and
the resin composition according to claim 1, with which the base material is impregnated or coated.

10. A metal foil-clad laminate comprising:
at least one or more of the prepregs according to claim 9 laminated; and
a metal foil disposed on one surface or both surfaces of the prepreg.

11. A resin sheet comprising:
a support; and
the resin composition according to claim 1, disposed on a surface of the support.

12. A printed circuit board comprising:
an insulating layer; and
a conductor layer formed on a surface of the insulating layer, wherein
the insulating layer comprises the resin composition according to claim 1.

* * * * *